(12) United States Patent
Diaham et al.

(10) Patent No.: US 11,476,045 B2
(45) Date of Patent: Oct. 18, 2022

(54) ELECTRIC FIELD GRADING PROTECTION DESIGN SURROUNDING A GALVANIC OR CAPACITIVE ISOLATOR

(71) Applicant: Analog Devices International Unlimited Company, Limerick (IE)

(72) Inventors: Sombel Diaham, Villeneuve les Bouloc (FR); Paul Lambkin, Carrigaline (IE); Bernard Patrick Stenson, Manister (IE); Patrick M. McGuinness, Limerick (IE); Laurence B. O'Sullivan, Ballinacurra (IE); Stephen O'Brien, Clarina (IE)

(73) Assignee: Analog Devices International Unlimited Company, Limerick (IE)

( * ) Notice: Subject to any disclaimer, the term of this patent is extended or adjusted under 35 U.S.C. 154(b) by 47 days.

(21) Appl. No.: 16/887,719

(22) Filed: May 29, 2020

(65) Prior Publication Data
US 2021/0375542 A1    Dec. 2, 2021

(51) Int. Cl.
| | |
|---|---|
| *H01G 2/22* | (2006.01) |
| *H01B 3/00* | (2006.01) |
| *H01B 5/16* | (2006.01) |
| *H01G 4/40* | (2006.01) |
| *H01L 23/528* | (2006.01) |
| *H01L 23/522* | (2006.01) |

(Continued)

(52) U.S. Cl.
CPC .............. *H01G 2/22* (2013.01); *H01B 3/004* (2013.01); *H01B 5/16* (2013.01); *H01F 27/324* (2013.01); *H01G 4/40* (2013.01); *H01L 23/528* (2013.01); *H01L 23/5223* (2013.01); *H01L 23/5225* (2013.01); *H01L 23/5227* (2013.01); *H01L 23/5329* (2013.01); *H01F 27/2804* (2013.01); *H01F 27/345* (2013.01); *H01F 2019/085* (2013.01); *H01F 2027/2809* (2013.01)

(58) Field of Classification Search
None
See application file for complete search history.

(56) References Cited

U.S. PATENT DOCUMENTS

| | | |
|---|---|---|
| 4,785,345 A | 11/1988 | Rawls et al. |
| 7,598,841 B2 | 10/2009 | McGuinness et al. |

(Continued)

FOREIGN PATENT DOCUMENTS

| | | |
|---|---|---|
| CN | 102737943 B | 8/2015 |
| JP | 2003068872 A | 3/2003 |

(Continued)

OTHER PUBLICATIONS

International Search Report and Written Opinion dated Oct. 26, 2021 for International Application No. PCT/IB2021/000369.

*Primary Examiner* — Katie L. Hammer
(74) *Attorney, Agent, or Firm* — Wolf, Greenfield & Sacks, P.C.

(57) ABSTRACT

Micro-isolators exhibiting enhanced isolation breakdown voltage are described. The micro-isolators may include an electrically floating ring surrounding one of the isolator elements of the micro-isolator. The isolator elements may be capacitor plates or coils. The electrically floating ring surrounding one of the isolator elements may reduce the electric field at the outer edge of the isolator element, thereby enhancing the isolation breakdown voltage.

20 Claims, 11 Drawing Sheets

(51) Int. Cl.
*H01L 23/532* (2006.01)
*H01F 27/32* (2006.01)
*H01F 27/34* (2006.01)
*H01F 19/08* (2006.01)
*H01F 27/28* (2006.01)

(56) References Cited

U.S. PATENT DOCUMENTS

| | | | |
|---|---|---|---|
| 7,741,943 B2 * | 6/2010 | Fouquet | H01F 27/2804 336/200 |
| 8,797,133 B2 | 8/2014 | Murillo et al. | |
| 8,971,013 B2 | 3/2015 | Wang | |
| 9,007,141 B2 | 4/2015 | Steeneken | |
| 9,196,817 B2 | 11/2015 | Werne et al. | |
| 9,380,705 B2 | 6/2016 | Chen | |
| 9,583,294 B2 | 2/2017 | Lee et al. | |
| 9,748,048 B2 | 8/2017 | Fitzgerald et al. | |
| 9,748,466 B2 | 8/2017 | Chen et al. | |
| 9,929,038 B2 | 3/2018 | O'Sullivan | |
| 9,941,565 B2 | 4/2018 | McLoughlin et al. | |
| 9,960,336 B2 | 5/2018 | Cornett et al. | |
| 9,978,696 B2 | 5/2018 | Bernardinis | |
| 10,148,263 B2 | 12/2018 | Coyne et al. | |
| 10,204,732 B2 | 2/2019 | Murphy et al. | |
| 10,224,474 B2 | 3/2019 | Cornett et al. | |
| 10,290,532 B2 | 5/2019 | Blennerhassett et al. | |
| 10,505,258 B2 | 12/2019 | Lee et al. | |
| 10,672,968 B2 | 6/2020 | McGuinness et al. | |
| 2006/0263727 A1 * | 11/2006 | Lee | H01L 24/48 430/311 |
| 2007/0063813 A1 | 3/2007 | McGuinness et al. | |
| 2008/0094168 A1 | 4/2008 | Hynes et al. | |
| 2008/0202209 A1 | 8/2008 | Lambkin et al. | |
| 2010/0259909 A1 * | 10/2010 | Ho | H03H 7/46 361/767 |
| 2013/0027170 A1 | 1/2013 | Chen | |
| 2014/0246066 A1 | 9/2014 | Chen et al. | |
| 2014/0252533 A1 | 9/2014 | O'Sullivan | |
| 2015/0311003 A1 | 10/2015 | Fitzgerald et al. | |
| 2015/0311021 A1 | 10/2015 | Lee et al. | |
| 2016/0064637 A1 | 3/2016 | Cornett et al. | |
| 2016/0133816 A1 | 5/2016 | Cornett et al. | |
| 2017/0025594 A1 | 1/2017 | McGuinness et al. | |
| 2017/0098604 A1 * | 4/2017 | Ho | H01L 23/5223 |
| 2017/0117084 A1 | 4/2017 | Murphy et al. | |
| 2017/0117602 A1 | 4/2017 | McLoughlin et al. | |
| 2017/0279444 A1 | 9/2017 | Coyne et al. | |
| 2018/0033565 A1 | 2/2018 | Fitzgerald et al. | |
| 2018/0040941 A1 | 2/2018 | Lee et al. | |
| 2018/0061569 A1 | 3/2018 | Kubik et al. | |
| 2018/0130867 A1 | 5/2018 | Lambkin et al. | |
| 2018/0139698 A1 | 5/2018 | Quinlan et al. | |
| 2018/0148318 A1 | 5/2018 | Flynn et al. | |
| 2018/0337084 A1 | 11/2018 | Blennerhassett et al. | |
| 2018/0358166 A1 | 12/2018 | Kubik et al. | |
| 2020/0076512 A1 | 3/2020 | O'Sullivan et al. | |

FOREIGN PATENT DOCUMENTS

| | | |
|---|---|---|
| JP | 3654872 B2 | 6/2005 |
| JP | 2017118020 A | 6/2017 |
| JP | 6486264 B2 | 3/2019 |
| TW | 201251033 A | 12/2012 |

* cited by examiner

ELECTRIC FIELD GRADING PROTECTION DESIGN SURROUNDING A GALVANIC OR CAPACITIVE ISOLATOR

FIELD OF THE DISCLOSURE

The present application relates to isolators providing galvanic isolation between circuits.

BACKGROUND

Isolators provide electrical isolation between circuits which communicate with each other. In some situations, circuits which communicate with each other operate at different voltages, for instance one at a relatively high voltage and the other at a relatively low voltage. In some situations, the circuits may or may not operate at different voltages than each other, but are referenced to different electrical ground potentials. Isolators can be used to electrically isolate circuits in either of these situations.

BRIEF SUMMARY

According to an aspect of the present application, micro-isolators exhibiting enhanced isolation breakdown voltage are described. The micro-isolators may include an electrically floating ring surrounding one of the isolator elements of the micro-isolator. The isolator elements may be capacitor plates or coils. The electrically floating ring surrounding one of the isolator elements may reduce the electric field at the outer edge of the isolator element, thereby enhancing the isolation breakdown voltage.

According to some embodiments, a micro-isolator with enhanced isolation breakdown voltage is provided, comprising: a first isolator element in a first plane; a second isolator element in a second plane; a first dielectric material, comprising a polymer, disposed between the first and second isolator elements; and an electrically floating ring disposed in the first plane and surrounding the first isolator element.

According to some embodiments, a micro-isolator with enhanced isolation breakdown voltage, comprising: first and second isolator elements disposed in respective planes; a dielectric material, comprising a polymer, disposed between the first and second isolator elements; and an electrically floating ring in-plane with and surrounding the first isolator element.

According to some embodiments, an isolated system, comprising: a first device configured to operate in a first voltage domain; a second device configured to operate in a second voltage domain; an isolator coupled between the first device and second device and comprising an electrically floating ring surrounding a first isolator element of a pair of vertically separated isolator elements.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

According to an aspect of the present application, an isolator element is positioned within an electrically floating conductive ring, with a non-linear dielectric material between them. In some embodiments, the isolator element is a coil, and in other embodiments it is a capacitor plate. In some embodiments, the isolator element and electrically floating conductive ring are both encapsulated by a dielectric material, which in some embodiments may be the same non-linear dielectric material between the isolator element and the electrically floating conductive ring. In some embodiments, the isolator element is encapsulated by the non-linear dielectric material while the electrically floating conductive ring is not. In some embodiments, the isolator element is encapsulated by a dielectric material differing from the non-linear dielectric material between the isolator element and the electrically floating conductive ring. According to some embodiments, multiple electrically floating conductive rings may surround the isolator element. They may be the same height as the isolator element or a different height. In some embodiments, an isolator comprising two isolator elements includes one or more electrically floating conductive rings around each of the isolator elements.

The aspects and embodiments described above, as well as additional aspects and embodiments, are described further below. These aspects and/or embodiments may be used individually, all together, or in any combination of two or more, as the application is not limited in this respect.

Figure 1A:
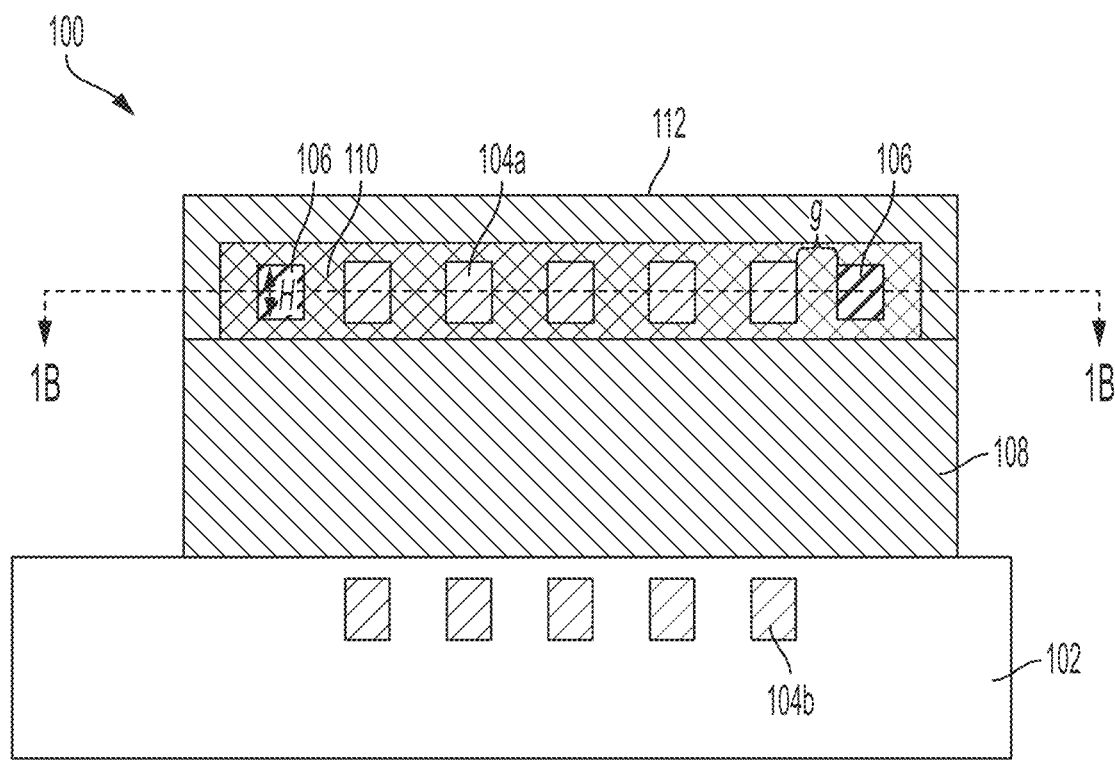
FIG. 1A illustrates a cross-sectional view of a micro-isolator having two isolator elements with a floating conductive ring around one, according to a non-limiting embodiment of the present application.

FIG. 1A illustrates a cross-sectional view of a micro-isolator having two isolator elements with a floating conductive ring around one. The micro-isolator 100 comprises a substrate 102, first isolator element 104a, second isolator element 104b, floating conductive ring 106, dielectric layer 108, non-linear dielectric 110, and dielectric layer 112.

The first isolator element 104a and second isolator element 104b are coils in this non-limiting example. The micro-isolator 100 may therefore work as an inductive micro-isolator, and may be a transformer. The first isolator element 104a and second isolator element 104b may be made of a metal, such as gold, aluminum, or copper. In some embodiments, the first isolator element 104a and second isolator element 104 are made of different materials. For example, isolator element 104a may be made of gold and isolator element 104b may be made of aluminum. In some embodiments, they may be made of the same material, such as being made of the same metal.

The floating conductive ring 106 may be made of a metal. In some embodiments, the floating conductive ring 106 may be made of the same metal as the first isolator element 104a. For example, they may be patterned from the same metal layer, although not all embodiments are limited in this respect. The first isolator element 104a and the floating ring 106 may be made of gold. The first isolator element 104a and floating conductive ring 106 have a height H. In this non-limiting embodiment, they have the same height, although alternatives are possible, with an example described further below. Electrical contact may be made to first isolator element 104a at its ends, as can be seen in FIG. 1B.

Figure 1B:
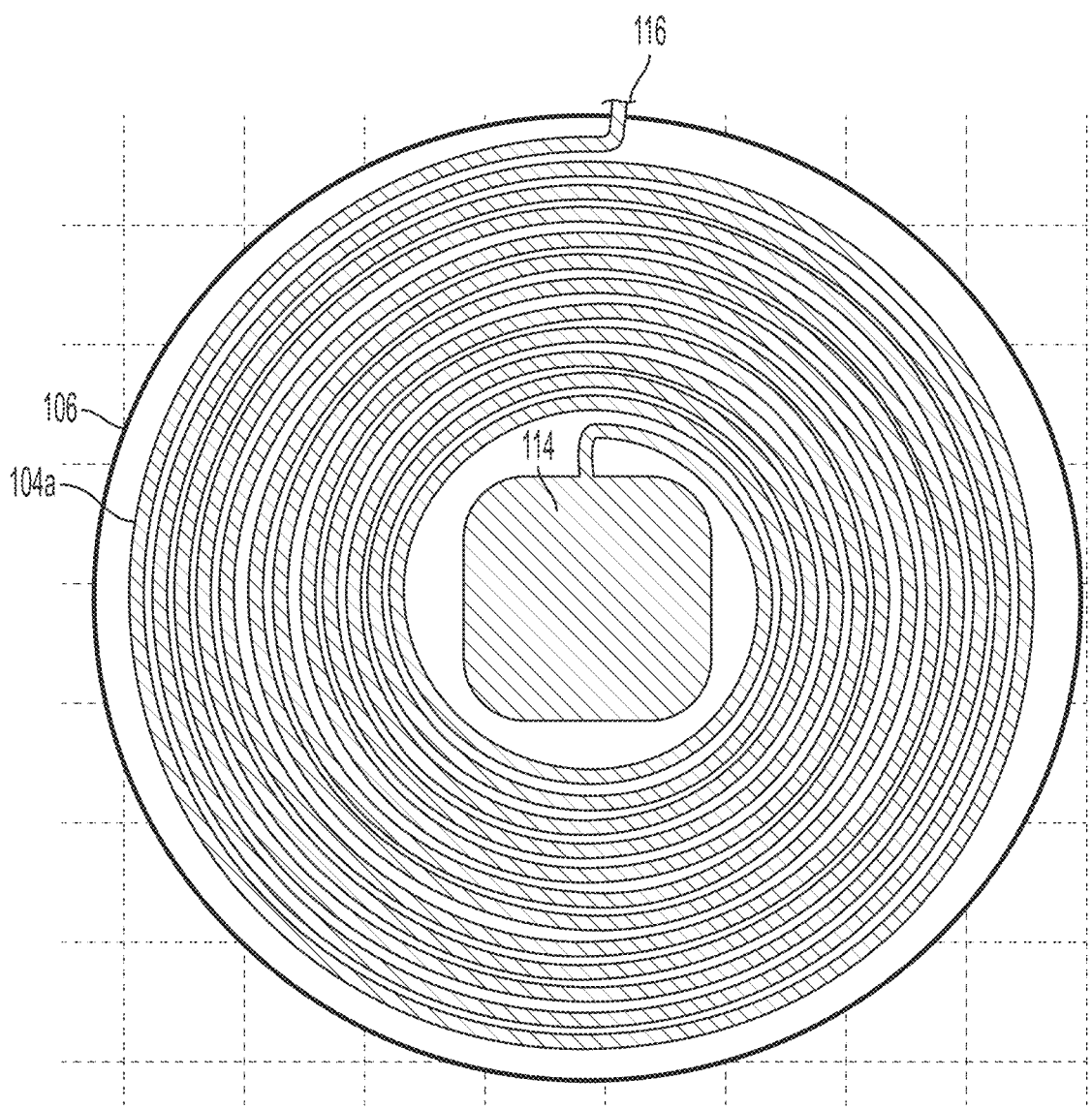
FIG. 1B is a top view of the micro-isolator of FIG. 1A taken along the line 1B-1B of FIG. 1A.

FIG. 1B is a top view of the micro-isolator 100 taken along the line 1B-1B of FIG. 1A. As shown, the floating conductive ring 106 surrounds the first isolator element 104a. The floating conductive ring is concentrically outside the first isolator element 104a. Electrical contact to the first isolator element 104a is made at pad 114 and end 116 (which may be a separate pad). The first isolator element 104a may pass over or under the floating conductive ring 106 near the end 116 to avoid being in electrical contact. In an alternative embodiment, floating conductive ring 106 may include a break or gap near the end 116 through which the first isolator element 104a passes. In some embodiments, the first isolator element 104a may be configured to receive a high voltage, such as greater than 200 Volts, greater than 500 Volts, greater than 1000 Volts, between 500 V and 3.5 kV, or any range or values within those ranges.

The first isolator element 104a and floating conductive ring 106 may have any suitable shapes. In the non-limiting example of FIG. 1B, they are circular. Alternative shapes are possible, however, as the various aspects described herein are not limited to a particular shape of isolator element or the floating conductive ring.

Returning to FIG. 1A, the dielectric layer 108 may be any suitable dielectric for isolating the first isolator element 104a from the second isolator element 104b. In some embodiments, the dielectric layer 108 comprises a polymer. For example, it may be polyimide. In some embodiments, the dielectric layer may comprise multiple layers. For example, the dielectric layer 108 may comprise two or more layers of polyimide, or a layer of polyimide and a layer of a second type of dielectric.

The first isolator element 104a and the floating conductive ring 106 are separated in-plane by a gap g. The gap g may have any suitable distance. The floating conductive ring 106 serves to reduce the electric field buildup at the outer edge of the first isolator element 104a, and may perform a grading function of smoothing the voltage between the first isolator element 104a and surrounding structures. As a result, the breakdown voltage of the micro-isolator 100 is increased compared to if the floating conductive ring 106 was omitted. The value of g may be selected to provide a desired level of electric field reduction. If g is too great, the floating conductive ring 106 may not meaningfully reduce the electric field at the outermost edge of the first isolator element 104a. If g is too small, electrical breakdown may occur between the first isolator element 104a and the floating conductive ring 106. In some embodiments, g may be in a range from 0.5 microns to 10 microns, including any value within that range. Other values are also possible.

The gap g is filled with the non-linear dielectric 110. The non-linear dielectric 110 may be a relatively conductive insulator to aid the electric field grading function of the floating conductive ring 106. In some embodiments, the non-linear dielectric 110 is stoichiometric silicon nitride ($SiN_{1.33}$) or non-stochiometric silicon nitride ($SiN_x$, with x not equal to 1.33). Alternatives include silicon oxynitride (SiONx), doped amorphous silicon (a-Si:H), doped amorphous carbon (a-C:H), silicon carbide (SiC), and zinc oxide (ZnO). When doped materials are used, any suitable doping may be employed to provide a level of conductivity resulting in a desired level of electric field grading. In some embodiments, the non-linear dielectric 100 may be a high-k ferroelectric materials like baryum titanate ($BaTiO_3$) strontium titanate ($SrTiO_3$), titanate dioxide ($TiO_2$), hafnium dioxide ($HfO_2$), zirconium dioxide ($ZrO_2$) or alumina ($Al_2O_3$), as they may exhibit similar electric field grading behavior. It should be noted that including a floating conductive ring in an isolator, without a non-linear dielectric between the first isolator element and the floating conductive ring, can decrease the electric breakdown voltage of the isolator, rather than decreasing it. Thus, the combination of a floating conductive ring with a conductive non-linear dielectric material between the isolator element and the floating conductive ring may provide the desired increase in electric breakdown voltage.

The dielectric layer 112 may be a passivation layer. In some embodiments, the dielectric layer 112 is polyimide. In some embodiments, the dielectric layer 112 is an oxide. Alternative materials are possible for the dielectric layer 112.

A non-limiting example of an implementation of the micro-isolator 100 is now provided. The substrate 102 may be formed of silicon or a dielectric (such as glass). The first isolator element 104a may be formed of gold. The second isolator element 104b may be formed of aluminum. The floating conductive ring 106 may be formed of gold. Alternative isolator elements 104a and 104b as well as the floating conductive ring 106 may be formed of copper. The dielectric layer 108 may be formed of polyimide and may be between 50 microns and 200 microns thick. The non-linear dielectric 110 may be formed of silicon nitride. The dielectric layer 112 may be formed of oxide. The height H may be 10 microns and the gap g may be 1 micron. Other materials and dimensions may be used in other embodiments. Also, it should be appreciated that some embodiments of a micro-isolator as described herein include one or more of the elements formed of the specific materials just described, but that one or more of the elements may be formed of different materials.

It should be appreciated from FIGS. 1A and 1B that in some embodiments a micro-isolator with enhanced isolation breakdown voltage is provided. The micro-isolator may comprise a first isolator element in a first plane, a second isolator element in a second plane, a first dielectric material, comprising a polymer such as polyimide, disposed between the first and second isolator elements, and an electrically floating conductive ring disposed in the first plane and surrounding the first isolator element. The first and second isolator elements may be separated in a vertical dimension (the up and down direction of FIG. 1A), and the first isolator element and floating conductive ring may be separated in a second dimension (the left-right direction in FIG. 1A).

Figure 2:
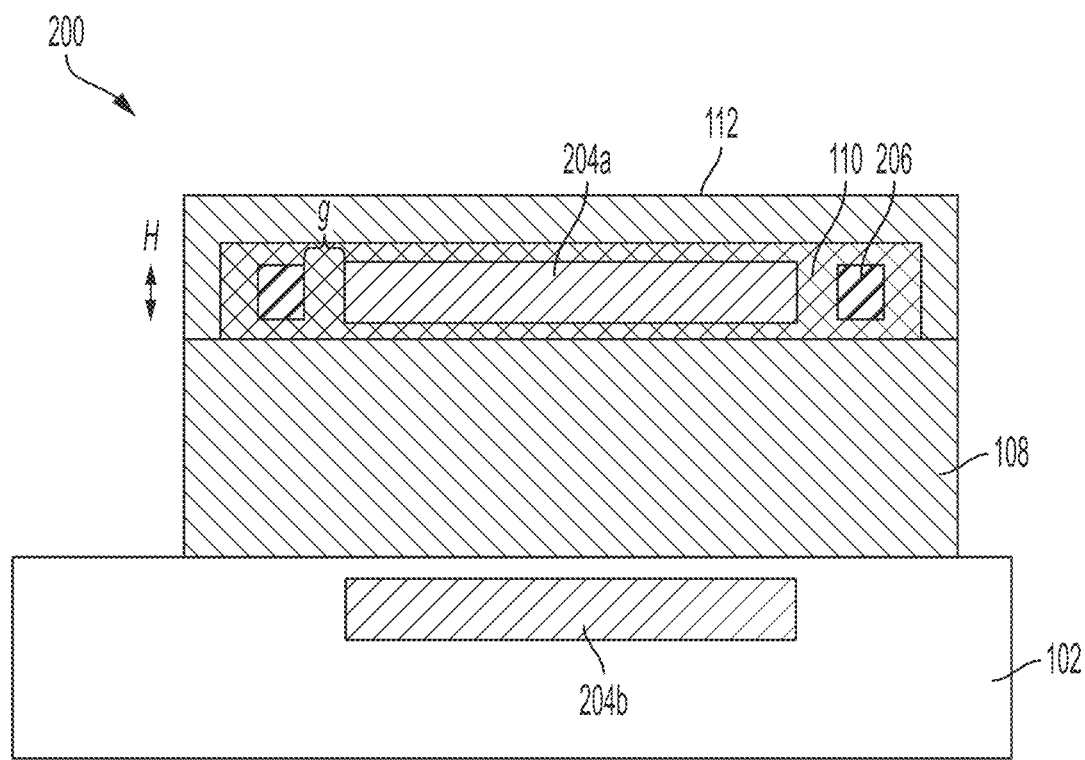
FIG. 2 illustrates an alternative micro-isolator according to a non-limiting embodiment.

FIG. 2 illustrates an alternative micro-isolator according to a non-limiting embodiment. The micro-isolator 200 differs from the micro-isolator 100 in that the micro-isolator 200 is a capacitive micro-isolator, having capacitor plates as the isolator elements. Specifically, the micro-isolator 200 comprises substrate 102, first isolator element 204*a*, second isolator element 204*b*, floating conductive ring 206, dielectric layer 108, non-linear dielectric 110, and dielectric layer 112. Substrate 102, dielectric layer 108, non-linear dielectric 110, dielectric layer 112, gap g, and height H were previously described in connection with FIG. 1A, and thus are not described in detail again here.

The first isolator element 204*a* and second isolator element 204*b* are capacitor plates. They may be formed of any suitable materials, such as the materials described previously in connection with first isolator element 104*a* and second isolator element 104*b*, respectively. The isolator elements 204*a* and 204*b* may have any suitable shapes. In some embodiments, they are circular, in other embodiments rectangular or square, and in still other embodiments may have different shapes. The floating conductive ring 206 may surround the first isolator element 204*a*. In some embodiments, the floating conductive ring 206 has the same shape as the first isolator element 204*a*, for example being a circle, a square, or other suitable shape. The floating conductive ring 206 may be made of any of the materials described previously in connection with floating conductive ring 106.

Figure 3:
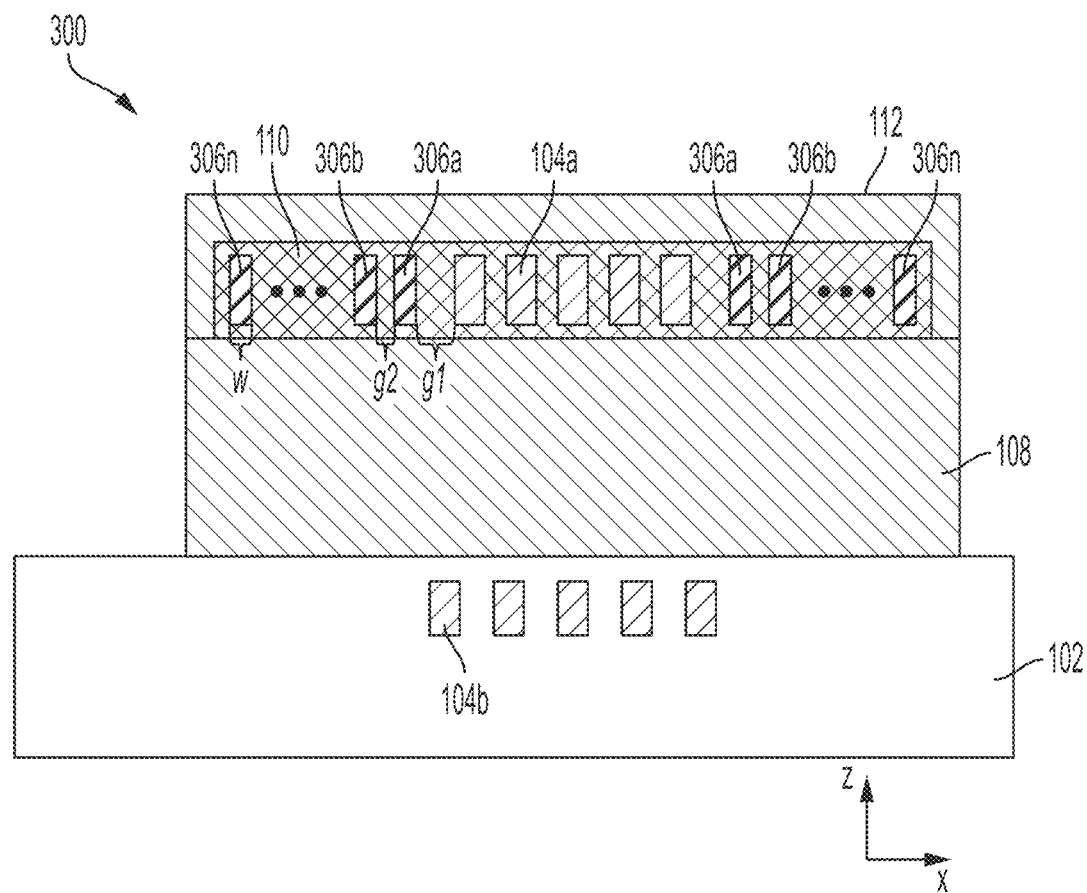
FIG. 3 illustrates a cross-sectional view of an alternative micro-isolator comprising multiple floating conductive rings, according to a non-limiting embodiment of the present application.

FIG. 3 illustrates a cross-sectional view of an alternative micro-isolator comprising multiple floating conductive rings, according to a non-limiting embodiment of the present application. The micro-isolator 300 comprises substrate 102, first isolator element 104*a*, second isolator element 104*b*, floating conductive rings 306*a*, 306*b* . . . 306*n*, dielectric layer 108, non-linear dielectric 110, and dielectric layer 112. The substrate 102, first isolator element 104*a*, second isolator element 104*b*, dielectric layer 108, non-linear dielectric 110, and dielectric layer 112 have been described previously herein in connection with FIGS. 1A and 1B, and therefore are not described again in detail here.

The floating conductive rings 306*a*, 306*b* . . . 306*n* may be any suitable floating conductive rings. Each of them may be substantially the same as the floating conductive ring 106 described previously in connection with FIGS. 1A and 1B, in terms of material and sizing. The floating conductive rings 306*a*, 306*b* . . . 306*n* have different radii (in the xy-plane), with floating conductive ring 306*a* having a shorter radius than floating conductive ring 306*b*, which in turn has a shorter radius than floating conductive ring 306*n*. The floating conductive rings 306*a* . . . 306*b* may be concentrically positioned with respect to each other.

Any suitable number n of floating conductive rings may be provided. In the embodiment of FIG. 3, between two and ten floating conductive rings may be provided. However, other numbers are possible.

The floating conductive rings 306*a* . . . 306*n* may be the same in terms of material, spacing, height, and width in some embodiments. However, in those embodiments in which multiple floating conductive rings are provided, one or more of those variables may be varied among the floating conductive rings. For example, in some embodiments, two or more of the floating conductive rings 306*a* . . . 306*n* may differ in height (in the z-direction in this figure). For example, some of the floating conductive rings may have the height H described previously, while others may have a shorter height, such as is described further below in connection with FIG. 6. Any suitable gaps may be provided between the floating conductive rings, as shown. The gap g1 is between the outermost edge of the first isolator element 104*a* and the floating conductive ring 306*a*. The gap g2 is between the floating conductive ring 306*a* and the floating conductive ring 306*b*. In some embodiments, the gaps increase in size the further from the first isolator element 104*a* they are. That is, the gap sizing may increase moving away from the first isolator element 104*a*. Increasing the gap size may increase the resistance between the floating conductive rings, which may facilitate electric field grading. The floating conductive rings may have widths w. In some embodiments, they have a uniform width. In other embodiments, the widths may be varied among the floating conductive rings 306*a* . . . 306*n*.

Figure 4:
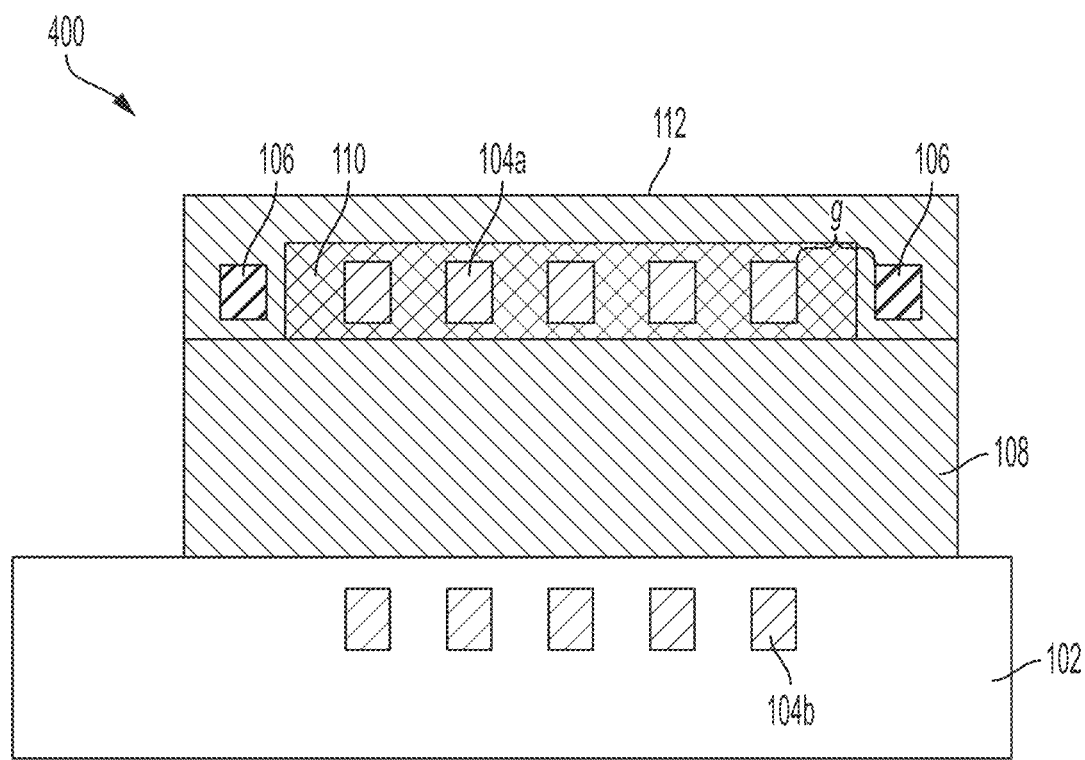
FIG. 4 illustrates a cross-sectional view of an alternative micro-isolator in which the floating conductive ring is not encapsulated by the same non-linear dielectric material encapsulating the isolator element 104a, according to an alternative embodiment.

FIG. 4 illustrates a cross-sectional view of an alternative micro-isolator in which the floating conductive ring is not encapsulated by the same non-linear dielectric material encapsulating the isolator element 104*a*, according to an alternative embodiment. The micro-isolator 400 includes many of the same components previously described in connection with FIGS. 1A and 1B. However, in contrast to the micro-isolator 100 of FIG. 1, the micro-isolator 400 is configured such that the non-linear dielectric 110 does not encapsulate the floating conductive ring 106. Such a configuration may be used for any suitable purpose. In some embodiments, manufacturing of the micro-isolator may be eased by forming the floating conductive ring 106 without being encapsulated by the non-linear dielectric 110. Other benefits may also be realized.

Figure 5:
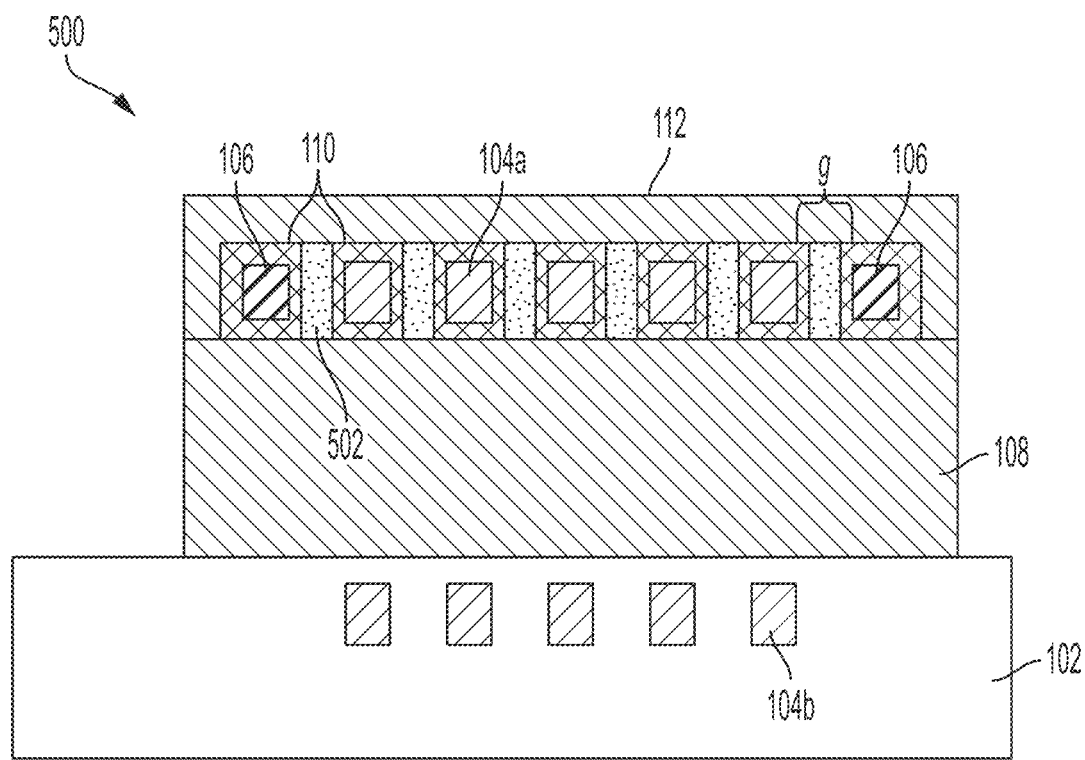
FIG. 5 illustrates a cross-sectional view of an alternative micro-isolator in which the non-linear dielectric material filling the gap between the isolator element and the floating conductive coil is a different material than that encapsulating the isolator element, according to a non-limiting embodiment of the present application.

FIG. 5 illustrates a cross-sectional view of an alternative micro-isolator in which the non-linear dielectric material filling the gap between the isolator element and the floating conductive ring is a different material than that encapsulating the isolator element, according to a non-limiting embodiment of the present application. The micro-isolator 500 comprises substrate 102, first isolator element 104*a*, second isolator element 104*b*, floating conductive ring 106, dielectric layer 108, non-linear dielectric 110, dielectric layer 112, and non-linear dielectric 502. The substrate 102, first isolator element 104*a*, second isolator element 104*b*, floating conductive ring 106, dielectric layer 108, non-linear dielectric 110, and dielectric layer 112 have been described previously herein in connection with FIGS. 1A and 1B, and therefore are not described again in detail here.

In the micro-isolator 500 the non-linear dielectric 110 does not entirely fill the space between the first isolator element 104*a* and the floating conductive ring 106. The non-linear dielectric 110 encapsulates the first isolator element 104*a* and floating conductive ring 106 in this non-limiting example, however a second non-linear dielectric 502 is included between the first isolator element 104*a* and the floating conductive ring 106. The non-linear dielectric 502 may be any suitable non-linear dielectric. In some embodiments the non-linear dielectric 110 and the non-linear dielectric 502 may exhibit similar properties. In some embodiments, the non-linear dielectric 110 and the non-linear dielectric 502 may exhibit differing non-linear properties. For example, one may be more strongly non-linear than the other in response to an electric field. One may be more conductive than the other.

Figure 6:
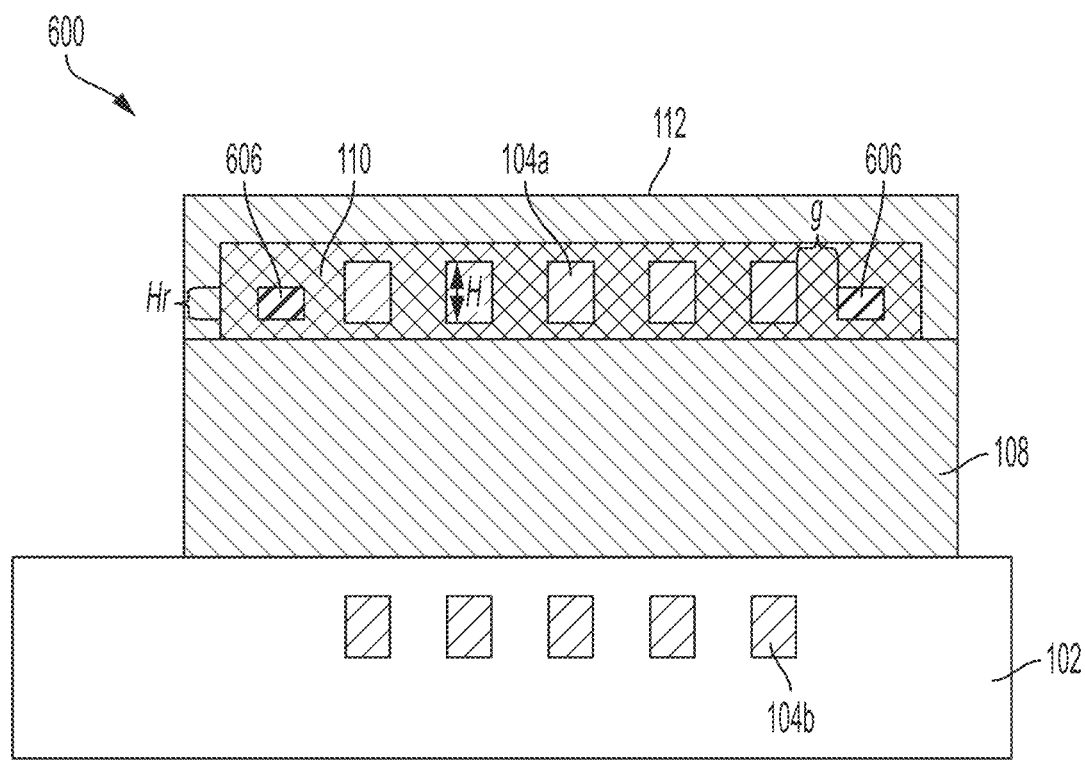
FIG. 6 illustrates a cross-sectional view of an alternative micro-isolator in which the floating conductive ring surrounding the isolator element has a different height than the isolator element, according to a non-limiting embodiment of the present application.

FIG. 6 illustrates a cross-sectional view of an alternative micro-isolator in which the floating conductive ring surrounding the isolator element has a different height than the isolator element. The micro-isolator 600 comprises substrate 102, first isolator element 104a, second isolator element 104b, floating conductive ring 606, dielectric layer 108, non-linear dielectric 110, and dielectric layer 112. The substrate 102, first isolator element 104a, second isolator element 104b, dielectric layer 108, non-linear dielectric 110, and dielectric layer 112 have been described previously herein in connection with FIGS. 1A and 1B, and therefore are not described again in detail here.

The floating conductive ring 606 differs from the floating conductive ring 106 of FIG. 1A in that its height differs from that of the first isolator element 104a. The floating conductive ring 606 has a height Hr, which differs from the height H of the first isolator element 104a. The height Hr may be selected to simplify fabrication. Filling the gap between the first isolator element 104a and the floating conductive ring may be difficult in practice depending on the height H of the first isolator element 104a. Making the height Hr less than H may facilitate filling the gap with the non-linear dielectric 110. The height Hr may be less than 90% of the height H, for example being between 10% and 90% of the height H, between 25% and 75% of the height H, less than 10% the height H, or less than 1% the height H, including any value within those ranges. As a non-limiting example, H may be 10 microns and Hr may be less than 1 micron, for example being on the order of 10 nanometers. In some alternative embodiments, Hr may be greater than H.

Figure 7:
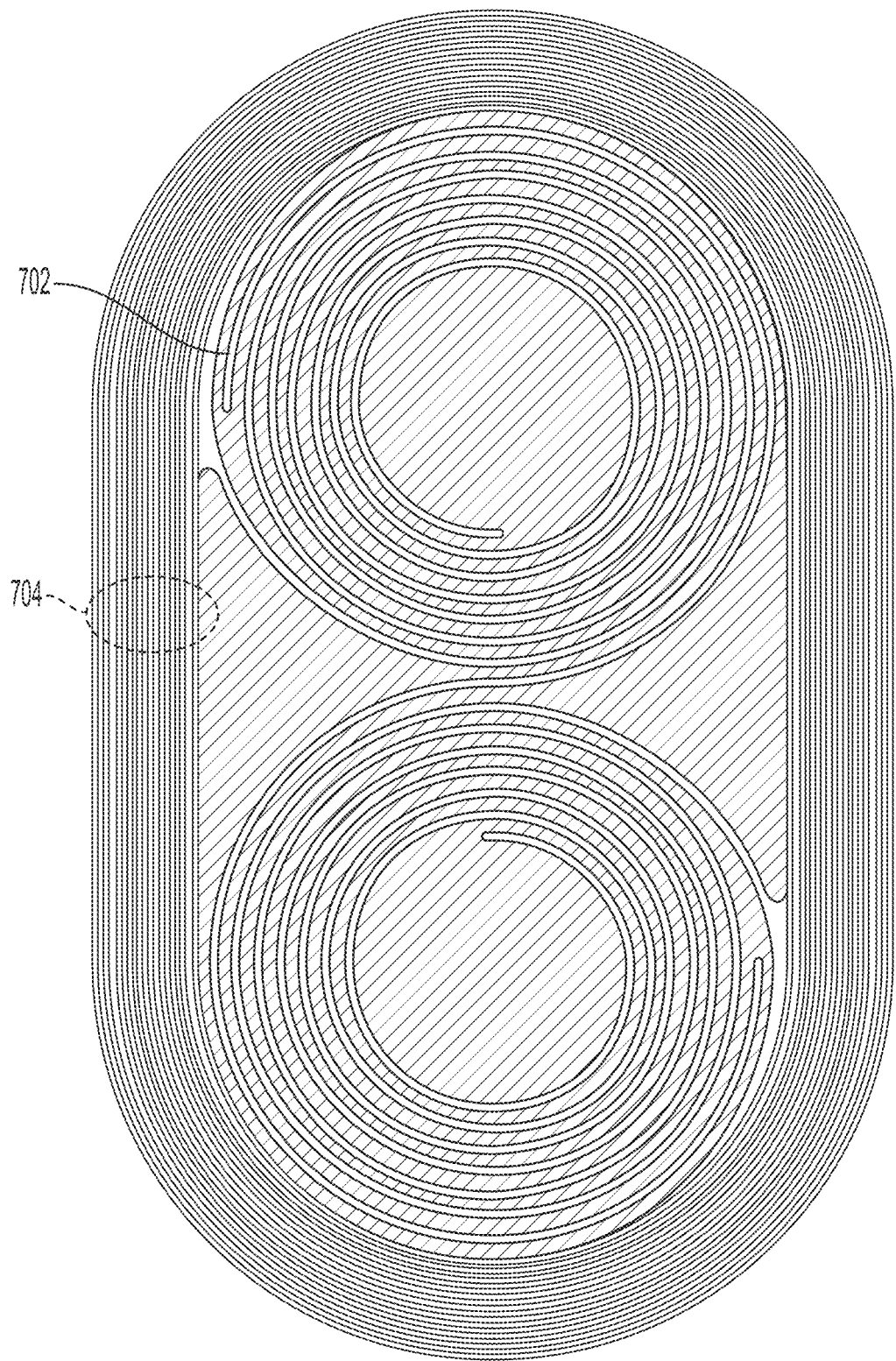
FIG. 7 illustrates a top view of a micro-isolator having a serpentine isolator element surrounded by a plurality of floating conductive rings, according to a non-limiting embodiment of the present application.

FIG. 7 illustrates a top view of a micro-isolator having a serpentine isolator element surrounded by a plurality of floating conductive rings, according to a non-limiting embodiment of the present application. The illustrated serpentine isolator element 702 may be formed of any of the materials described previously herein in connection with first and second isolator elements 104a and 104b. The floating conductive rings 704 are oval or race-track shaped, and may be formed of any of the materials described previously herein in connection with floating conductive ring 106. The number of floating conductive rings 704 is not limiting. In this non-limiting example, ten floating conductive rings 704 are included. The floating conductive rings 704 each surround the serpentine isolator element 702. The floating conductive rings 704 are concentrically positioned with respect to each other.

Figure 8:
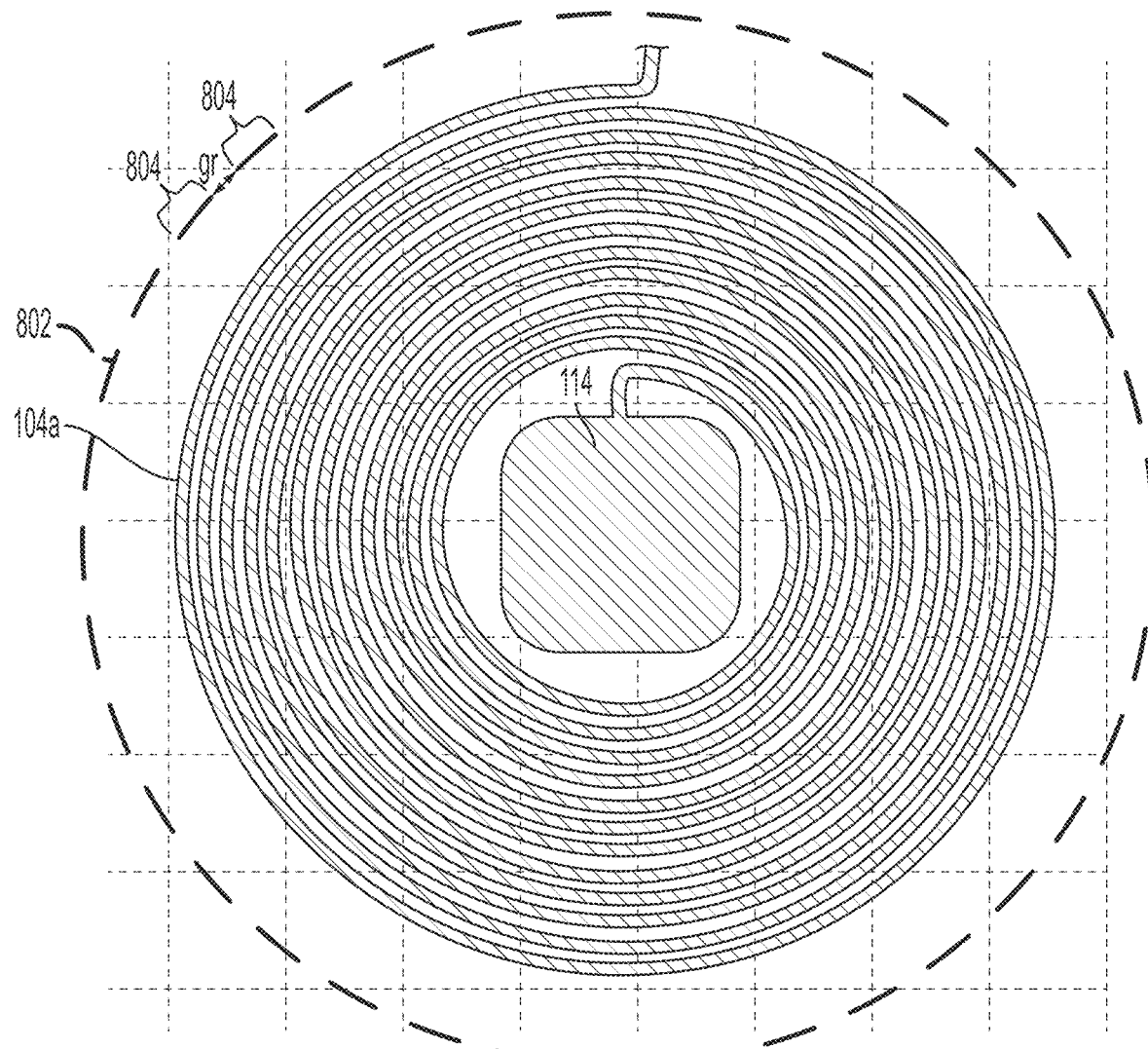
FIG. 8 illustrates a top view of a micro-isolator having a segmented floating conductive ring surrounding an isolator element, according to a non-limiting embodiment of the present application.

FIG. 8 illustrates a top view of a micro-isolator having a segmented floating conductive ring surrounding an isolator element, according to a non-limiting embodiment of the present application. The illustrated micro-isolator comprises isolator element 104a and segmented floating conductive ring 802. The isolator element 104a was described previously in connection with FIGS. 1A and 1B, and thus is not described in detail again here. The segmented floating conductive ring 802 surrounds the isolator element 104a. The segmented floating conductive ring 802 comprises a plurality of segments 804 separated by gaps gr. The number of segments 804 and the distance of the gaps gr may be selected to provide a desired level of electric field grading.

While FIG. 8 illustrates an example of a segmented floating conductive ring, a further alternative is a ring formed by a plurality of metallic inclusions. That is, in some embodiments, a ring of dielectric material with metallic inclusions may be used as a floating conductive ring. The amount and size of the metallic inclusions may be selected to provide a desired level of electric field grading.

Figure 9:
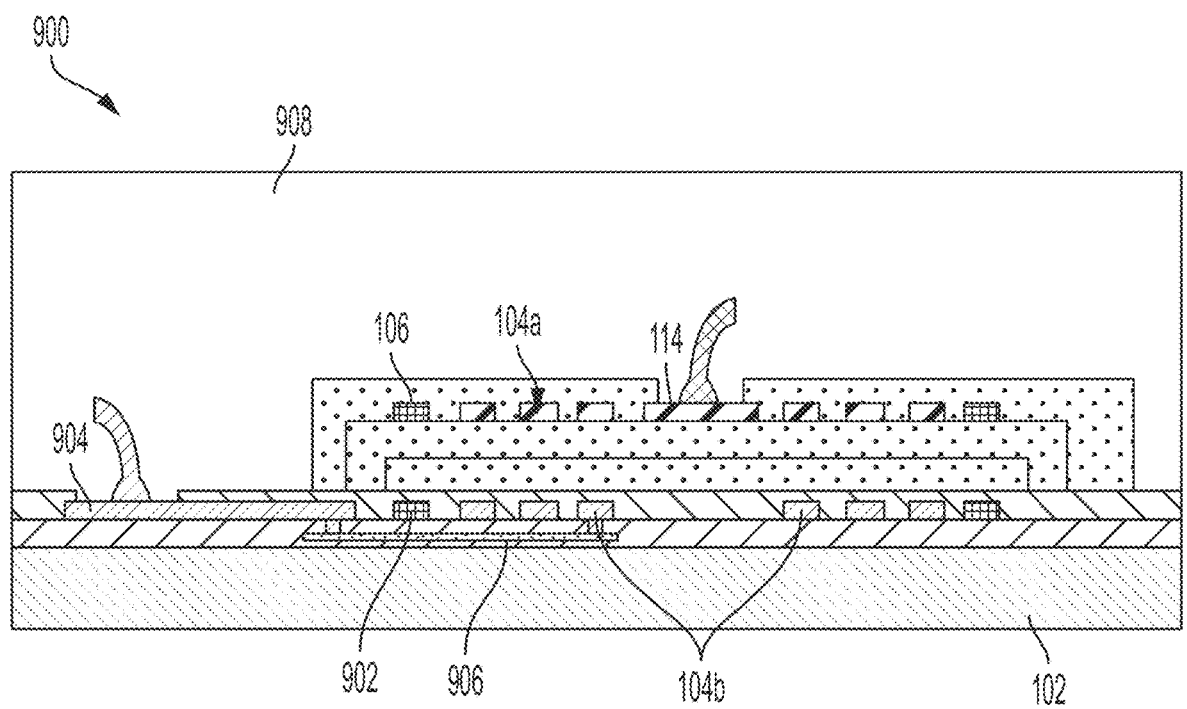
FIG. 9 illustrates a cross-sectional view of a micro-isolator having floating conductive rings surrounding both the top and bottom isolator elements, according to a non-limiting embodiment of the present application.

FIG. 9 illustrates a cross-sectional view of a micro-isolator having floating conductive rings surrounding both the top and bottom isolator elements, according to a non-limiting embodiment of the present application. The micro-isolator 900 comprises substrate 102, first isolator element 104a, second isolator element 104b, floating conductive ring 106, dielectric layer 108, non-linear dielectric 110, dielectric layer 112, and floating conductive ring 902. The substrate 102, first isolator element 104a, second isolator element 104b, floating conductive ring 106, dielectric layer 108, non-linear dielectric 110, and dielectric layer 112 have been described previously herein in connection with FIGS. 1A and 1B, and therefore are not described again in detail here.

The floating conductive ring 902 surrounds the isolator element 104b. The floating conductive ring 902 may be substantially the same as the floating conductive ring 106. In some embodiments, however, the floating conductive ring 902 may be formed of the same material as the isolator element 104b. Thus, in some embodiments, the floating conductive rings 106 and 902 are made of different materials.

FIG. 9 shows that the micro-isolator 900 may include electrical access to the second isolator element 104b by way of a pad 904 and electrical interconnect structure 906. In this manner, a center of the second isolator element 104b may be electrically contacted even though the pad 904 is in the same plane as the second isolator element 104b.

The micro-isolator 900 also includes an encapsulant 908. The encapsulant 908 may be a resin or any other suitable material.

While FIG. 1A illustrates a micro-isolator having a floating conductive ring surrounding a top isolator element, and FIG. 9 illustrates an embodiment with floating conductive rings surrounding top and bottom isolator elements, an alternative embodiment of a micro-isolator includes a floating conductive ring surrounding a bottom isolator element only. In general, it may be desirable to have a floating conductive ring surrounding the isolator element that receives a high voltage. In some embodiments, that may be a top isolator element, and in some embodiments it may be a bottom isolator element. Thus, floating conductive rings of the types described herein may be positioned around top or bottom isolator elements, or both. In some embodiments, a micro-isolator includes two or more isolator elements, with a floating conductive ring surrounding one or more of them.

An isolator of the types described herein may be deployed in various settings to galvanically isolate one portion of an electric circuit from another. One such setting is in industrial applications. In some embodiments, an isolator may isolate a motor driver from other portions of an electric system. The motor driver may operate at voltages equal to or greater than 600V in some embodiments (e.g., up to 3.5 kV or more), and may comprise an inverter to convert a DC signal to an AC signal. In some embodiments, the motor driver may comprise one or more insulated gate bipolar transistors (IGBT), and may drive an electric motor according to a three-phase configuration.

Another such setting is in photovoltaic systems. In some embodiments, an isolator may be installed in a photovoltaic system to isolate a photovoltaic panel and/or an inverter from other parts of the system. In some embodiments, an isolator may be installed between a photovoltaic panel and an inverter.

Another such setting is in electric vehicles. In some embodiments, an isolator of the types described herein may be used to isolate any suitable part of an electric vehicle, such as a battery or a motor driver, from other parts of the vehicle.

Figure 10:
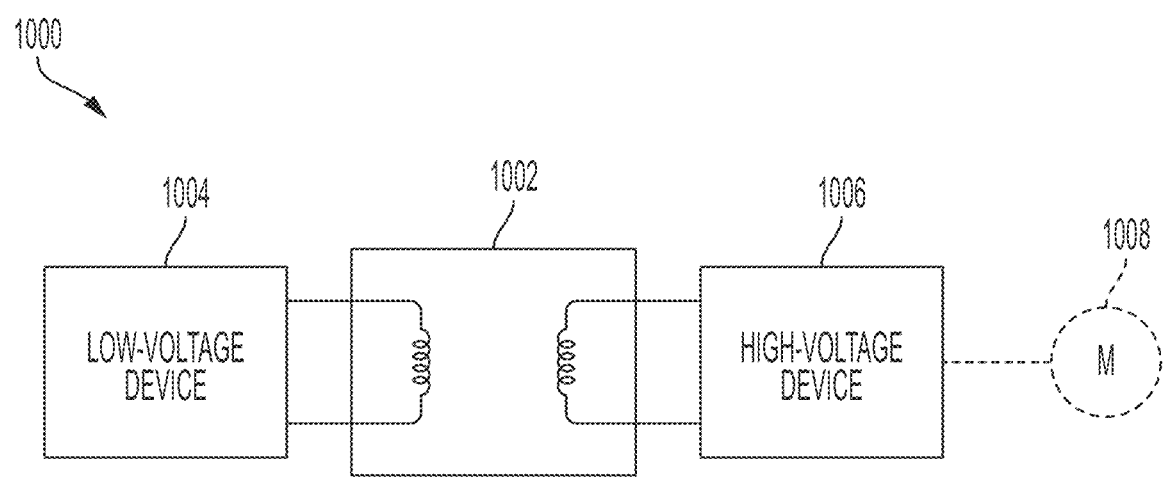
FIG. 10 is a block diagram illustrating an example of a system comprising an isolator of the types described herein.

FIG. 10 is a block diagram illustrating an example of a system comprising an isolator of the types described herein. System 1000 may comprise isolator 1002, low-voltage device 1004, and high-voltage device 1006. In some embodiments, low-voltage device 1004 may comprise a device operating at less than 500V. In some embodiments, high-voltage device 1006 may comprise a device operating at 500V or higher.

Isolator 1002 may be implemented using micro-isolator 100, 200, 300, 400, 500, 600, or 900 and may be disposed between the low-voltage device and the high-voltage device. By isolating the two devices from one another, a user may be able to physically contact the low-voltage device without being electrically shocked or harmed. Low-voltage device 1004 may comprise a user interface unit, such as a computer or other types of terminals, and/or a communication interface, such as a cable, an antenna or an electronic transceiver. High-voltage device 1006 may comprise a motor driver, an inverter, a battery, a photovoltaic panel, or any other suitable device operating at 500V or higher. In the embodiments in which high-voltage device 1006 comprises a motor driver, high-voltage device 1006 may be connected to an electric motor 1008.

It should be appreciated from the description of FIG. 10 and the types of micro-isolators described herein that some embodiments of the present application provide an isolated system, comprising: a first device configured to operate in a first voltage domain; a second device configured to operate in a second voltage domain; and an isolator coupled between the first device and second device and comprising an electrically floating ring surrounding a first isolator element of a pair of vertically separated isolator elements.

The electrically floating ring may be a first electrically floating ring, and the isolated system may further comprise a second electrically floating ring surrounding a second isolator element of the pair of vertically separated isolator elements. In some embodiments, one or both—when multiple floating conductive rings are provided—are segmented rings. The electrically floating conductive ring may be shorter than the isolator element it surrounds, in some embodiments. In any such embodiments, a non-linear dielectric material may encapsulate the isolator element that is surrounded by a floating conductive ring.

Aspects of the present application may provide one or more benefits, some of which have been previously described. Now described are some non-limiting examples of such benefits. It should be appreciated that not all aspects and embodiments necessarily provide all of the benefits now described. Further, it should be appreciated that aspects of the present application may provide additional benefits to those now described.

Aspects of the present application provide an isolator capable of withstanding voltages exceeding 300V (e.g., 1 kV, 1.5 kV, 2 kV, 2.5 kV, 3 kV, and 3.5 kV) while limiting the probability of electric breakdown. As a result of such a reduction in the probability of electric breakdown, the lifetime of the isolator may be extended.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A micro-isolator with enhanced isolation breakdown voltage, comprising:
   a first isolator element in a first plane, wherein the first isolator element comprises a first coil or a first plate;
   a second isolator element in a second plane, wherein the second isolator element comprises a second coil or a second plate;
   a first dielectric material, comprising a polymer, disposed between the first and second isolator elements;
   a first electrically floating conductive ring disposed in the first plane and surrounding the first isolator element; and
   a second electrically floating conductive ring concentric with the first electrically floating conductive ring,
   wherein the first electrically floating conductive ring and the second electrically floating conductive ring differ in one or more of height, width, or material.

2. The micro-isolator of claim 1, wherein the first isolator element and the second isolator element are separated in a vertical dimension and the first isolator element and the first electrically floating conductive ring are separated in a second dimension.

3. The micro-isolator of claim 1, further comprising a second dielectric material separating the first isolator element from the first electrically floating conductive ring.

4. The micro-isolator of claim 3, wherein the second dielectric material encapsulates the first isolator element.

5. The micro-isolator of claim 1, wherein the first isolator element has a first height, and wherein the first electrically floating conductive ring has a second height less than the first height.

6. The micro-isolator of claim 1, wherein the first electrically floating conductive ring is a segmented ring.

7. The micro-isolator of claim 1, wherein the first isolator element is configured to couple to a higher voltage than the second isolator element.

8. A micro-isolator with enhanced isolation breakdown voltage, comprising:
   first and second isolator elements disposed in respective planes, wherein the first isolator element comprises a first coil or a first plate and the second isolator element comprises a second coil or a second plate;
   a dielectric material, comprising a polymer, disposed between the first and second isolator elements; and
   an electrically floating ring in-plane with and surrounding the first isolator element,
   wherein the first isolator element has a first height, and wherein the electrically floating ring has a second height less than the first height.

9. The micro-isolator of claim 8, wherein the electrically floating ring is a first electrically floating ring, and wherein the micro-isolator further comprises a second electrically floating ring concentric with the first electrically floating ring.

10. The micro-isolator of claim 8, wherein the dielectric material is a first dielectric material, the micro-isolator further comprising a second dielectric material separating the first isolator element from the electrically floating ring.

11. The micro-isolator of claim 10, wherein the second dielectric material encapsulates the first isolator element but not the electrically floating ring.

12. The micro-isolator of claim 8, wherein the electrically floating ring comprises one or more gaps.

13. The micro-isolator of claim 8, wherein the first isolator element is configured to couple to a higher voltage than the second isolator element.

14. A micro-isolator with enhanced isolation breakdown voltage, comprising:
a first plane comprising a first isolator element, wherein the first isolator element comprises a first coil or a first plate;
a second plane comprising a second isolator element, wherein the second isolator element comprises a second coil or a second plate;
polymer, disposed between the first and second isolator elements;
a first electrically floating conductive ring disposed in the first plane and surrounding the first isolator element; and
a second electrically floating conductive ring concentric with the first electrically floating conductive ring,
wherein the first electrically floating conductive ring and the second electrically floating conductive ring differ in one or more of height, width, or material.

15. The micro-isolator of claim 14, wherein the first isolator element and the second isolator element are separated in a vertical dimension and the first isolator element and the first electrically floating conductive ring are separated in a second dimension.

16. The micro-isolator of claim 14, further comprising a second dielectric material separating the first isolator element from the first electrically floating conductive ring.

17. The micro-isolator of claim 16, wherein the second dielectric material encapsulates the first isolator element.

18. The micro-isolator of claim 1, further comprising a third electrically floating conductive ring concentric with the second electrically floating conductive ring, wherein a first gap between the third electrically floating conductive ring and the second electrically floating conductive ring differs from a second gap between the second electrically floating conductive ring and the first electrically floating conductive ring.

19. The micro-isolator of claim 1, wherein the first electrically floating conductive ring and the second electrically floating conductive ring differ in height.

20. The micro-isolator of claim 14, further comprising a third electrically floating conductive ring concentric with the second electrically floating conductive ring, wherein a first gap between the third electrically floating conductive ring and the second electrically floating conductive ring differs from a second gap between the second electrically floating conductive ring and the first electrically floating conductive ring.

* * * * *

UNITED STATES PATENT AND TRADEMARK OFFICE
CERTIFICATE OF CORRECTION

PATENT NO. : 11,476,045 B2
APPLICATION NO. : 16/887719
DATED : October 18, 2022
INVENTOR(S) : Sombel Diaham et al.

Page 1 of 1

It is certified that error appears in the above-identified patent and that said Letters Patent is hereby corrected as shown below:

In the Claims

Column 11, Claim 14, Line 9, "polymer" should read --a polymer--.

Signed and Sealed this
Third Day of January, 2023

Katherine Kelly Vidal
*Director of the United States Patent and Trademark Office*